(12) United States Patent
Byeon

(10) Patent No.: US 8,274,856 B2
(45) Date of Patent: Sep. 25, 2012

(54) INTERNAL VOLTAGE GENERATOR AND SEMICONDUCTOR MEMORY DEVICE INCLUDING THE SAME

(75) Inventor: Sang-Jin Byeon, Kyoungki-do (KR)

(73) Assignee: Hynix Semiconductor Inc., Kyoungki-do (KR)

(*) Notice: Subject to any disclaimer, the term of this patent is extended or adjusted under 35 U.S.C. 154(b) by 464 days.

(21) Appl. No.: 12/165,057

(22) Filed: Jun. 30, 2008

(65) Prior Publication Data

US 2009/0257289 A1    Oct. 15, 2009

(30) Foreign Application Priority Data

Apr. 14, 2008    (KR) .................. 10-2008-0034110

(51) Int. Cl.
*G11C 5/14*    (2006.01)
(52) U.S. Cl. ................ 365/226; 365/189.09; 365/233.1; 323/313
(58) Field of Classification Search .................. 365/226, 365/189.09, 233.1; 323/313
See application file for complete search history.

(56) References Cited

U.S. PATENT DOCUMENTS

| | | | | |
|---|---|---|---|---|
| 5,541,536 A | * | 7/1996 | Rajivan | 326/98 |
| 5,689,460 A | * | 11/1997 | Ooishi | 365/189.07 |
| 6,636,090 B2 | * | 10/2003 | Ito | 327/157 |
| 6,661,728 B2 | * | 12/2003 | Tomita et al. | 365/189.09 |
| 2003/0156462 A1 | * | 8/2003 | Lim et al. | 365/189.05 |
| 2006/0104144 A1 | * | 5/2006 | Byeon et al. | 365/226 |
| 2007/0001753 A1 | * | 1/2007 | Byeon | 327/541 |
| 2007/0183225 A1 | * | 8/2007 | Barth | 365/189.09 |
| 2008/0106427 A1 | * | 5/2008 | Mayerl et al. | 340/661 |

FOREIGN PATENT DOCUMENTS

JP    2004-070805    3/2004
KR    1020010060811 A    7/2001

OTHER PUBLICATIONS

Notice of Allowance issued from the Korean Intellectual Property Office on Jul. 28, 2009 with an English Translation.
Notice of Prelimary Rejection issued from the Korean Intellectual Property Office on Apr. 30, 2009 with an English Translation.

* cited by examiner

*Primary Examiner* — Vu Le
*Assistant Examiner* — Han Yang
(74) *Attorney, Agent, or Firm* — IP & T Group LLP

(57) ABSTRACT

A semiconductor device including an internal voltage generator circuit that provides an internal voltage having a different level depending on the operation speed is provided. The semiconductor device includes an internal voltage generator circuit configured to receive operation speed information to generate an internal voltage having a different level depending on the operation speed; and an internal circuit operated using the internal voltage.

5 Claims, 15 Drawing Sheets

INTERNAL VOLTAGE GENERATOR AND SEMICONDUCTOR MEMORY DEVICE INCLUDING THE SAME

CROSS-REFERENCE TO RELATED APPLICATION

The present invention claims priority of Korean patent application number 10-2008-0034110, filed on Apr. 14, 2008, which is incorporated by reference in its entirety.

BACKGROUND OF THE INVENTION

The present invention relates to an internal voltage generator and a semiconductor memory device including the same.

A variety of semiconductor devices generate and use a variety of internal voltages that are different in level from an external supply voltage. In particular, a semiconductor memory device generates a variety of reference voltages VREF that are used as a reference for a circuit operation, a voltage VCORE that is used in a core region of the memory device, a voltage VPP that is higher than an external voltage applied to a word line or a gate of a cell transistor, and a voltage VBB that is lower than a ground voltage used in a bulk of a cell transistor.

FIG. 1 is a block diagram of a conventional circuit for generating a reference voltage VREF.

Referring to FIG. 1, a conventional reference voltage generator circuit includes a band gap unit 110 and a voltage divider 120.

The band gap unit 110 generates a band gap voltage VGB with a predetermined level in response to a change in PVT (Process, Voltage and Temperature). The voltage divider 120 generates an internal voltage VREF using the band gap voltage VBG. The band gap unit 110 and the voltage divider 120 will be described in detail with reference to FIGS. 2 and 3.

FIG. 2 is a circuit diagram of the band gap unit 110 illustrated in FIG. 1.

Referring to FIG. 2, the band gap unit 110 is implemented using a vertical PNP BJT transistor that is small in terms of a process change. This includes a combination of a Proportional to Absolute Temperature (PTAT) term, which causes the amount of current to increase with temperature, and a Complementary proportional to Absolute Temperature (CTAT) term, which causes the current flow to decrease with temperature.

On the assumption that a node A and a node B are virtually shorted in the circuit, a general diode current-voltage relationship, which is represented by an emitter current of two BJTs Q1 and Q2 with a ratio of N:1, can be expressed as Equation (1).

$$I_Q = I_S(\exp[V_{BE}/V_T] - 1) \approx I_S \exp[V_{BE}/V_T]_{V_{BE} \gg V} \quad (1)$$

Applying this to Q1 and Q2 results in Equation (2)

$$I_{Q1} = I_S \exp[V_{BE1}/V_T], \quad I_{Q2} = I_S \exp[V_{BE2}/V_T] \quad (2)$$

where $I_{Q1}$ denotes a current flowing through the first BJT, and $I_{Q2}$ denotes a current flowing through the second BJT.

If the node A and the node B have the same potential, a current IPTAT flowing through a first resistor R1 can be expressed as Equation (3).

$$I_{PTAT} = (V_{BE1} - V_{BE2})/R_1 = \ln(N \cdot \alpha) \cdot V_T/R_1 \quad (3)$$

Under the same condition, a current ICTAT flowing through a second resistor R2 can be expressed as Equation (4).

$$I_{CTAT} = V_{BE1}/R_2 \quad (4)$$

On the assumption that the same amount of current flows through MOSs of the same size, a current M*IPTAT and a current K*ICTAT respectively become M*IPTAT and K*ICTAT as illustrated in FIG. 2.

Based on this, an output voltage VBG of the band gap unit 110 can be expressed as Equation (5).

$$VBG = K \cdot R_1/R_2 \cdot (V_{BE1} + (M \cdot R_1/K \cdot R_1) \cdot \ln(N \cdot \alpha) \cdot V_T) \quad (5)$$

If the values M, R1, R2, R3, K and M are suitably adjusted for temperature compensation, the output voltage VBG has a constant value regardless of a PVT change. In general, if the current amounts PTAT and CTAT are adjusted by adjusting only the values K and M while fixing the values N, R1, R2 and R3.

That is, the band gap unit 110 outputs a voltage VBG that has a constant value regardless of a PVT change.

FIG. 3 is a circuit diagram of the voltage divider 120 illustrated in FIG. 1.

Referring to FIG. 3, the voltage divider 120 includes an OP amplifier 310, a PMOS transistor 320, and resistors 330 and 340.

In operation, the output voltage VBG of the band gap unit 110 is input into the OP amplifier 310 and then the output of the OP amplifier 310 is input into a gate of the PMOS transistor 320 to drive the PMOS transistor 320. As a result, the voltage levels of both inputs of the OP amplifier 310 become identical to each other. That is, the potential level of a node C becomes VBG.

The voltage VBG of the node C is voltage-divided by the resistors 330 and 340. Thus, according to the resistance ratio, an internal voltage VREF={VBG*(Resistance 340+Resistance 330)/Resistance 340}.

The level of the internal voltage VREF, which is generated through the above operation, does not easily change even in case of a PVT change. Therefore, the internal voltage VREF is used as a reference voltage for various circuits in a semiconductor device. The internal voltage VREF may also be used as a reference voltage for generating the other internal voltages (e.g., VCORE, VBB and VPP), where the level of the reference voltage differs depending on the type of the internal voltage.

FIG. 4 is a block diagram of a conventional circuit for generating a negative voltage VBB that has a lower level than a ground voltage VSS.

Referring to FIG. 4, a conventional negative voltage generator circuit includes: a negative voltage detector 410 configured to detect the level of a negative voltage VBB and to output a pump enable signal BBWEB if the level of the negative voltage VBB is not sufficiently low; and a negative voltage pump 420 configured to pump the negative voltage VBB in response to the pump enable signal BBWEB output from the negative voltage detector 410.

The negative voltage detector 410 detects the level of a negative voltage VBB, and outputs a pump enable signal BBWEB that is used to determine whether to drive the negative voltage pump 420. The negative voltage pump 420 pumps the negative voltage VBB in response to the pump enable signal BBWEB output from the negative voltage detector 410. The negative voltage pump 420 includes oscillator 421, a pump controller 422, and a charge pump 423.

The oscillator 421 receives the pump enable signal BBWEB and outputs a periodic signal OSC. The pump controller 422 outputs pump control signals P1, P2, G1 and G2 in response to the periodic signal OSC output from the oscillator 421. The charge pump 423 outputs a negative voltage VBB in response to the pump control signals P1, P2, G1 and G2 output from the pump controller 422.

In the overall operation, if the level of the negative voltage VBB detected by the negative voltage detector 410 is sufficiently low (i.e., BBWEB Disable), the negative voltage pump 420 stops a pumping operation. On the other hand, if the level of the negative voltage VBB detected by the negative voltage detector 410 is not sufficiently low (i.e., BBWEB Enable), the negative voltage pump 420 performs a pumping operation.

FIG. 5 is a circuit diagram of the negative voltage detector 410 illustrated in FIG. 4.

Referring to FIG. 5, a ground voltage VSS is applied to a gate of a first transistor P01, and a negative voltage VBB is applied to a gate of a second transistor P02. The transistors P01 and P02 operate in a linear region, and serve as resistors to divide a high-potential voltage VREFB and a low-potential voltage VSS. For example, if the absolute value of the negative voltage VBB is small (i.e., if the level of the negative voltage VBB is high) and thus the resistance of the second transistor P02 increases, the voltage level of a node DET increases and thus a third inverter 103 outputs a low-level detection signal BBWEB (i.e., the negative voltage VBB is pumped). On the other hand, if the absolute value of the negative voltage VBB is large (i.e., if the level of the negative voltage VBB is low) and thus the resistance of the second transistor P02 decreases, the voltage level of the node DET decreases and thus the third inverter 103 outputs a high-level detection signal BBWEB (i.e., the negative voltage pumping operation is stopped).

That is, the negative voltage detector 410 detects the level of the negative voltage VBB by the voltage division of the transistors P01 and P02 that respectively receive the ground voltage VSS and the negative voltage VBB.

For reference, FIG. 5 exemplifies VREFB as a high-potential voltage, which can be obtained using a reference voltage generator circuit as illustrated in FIG. 1. This, however, is merely exemplary, and a variety of other voltages (e.g., VCORE and VDD) may be used.

FIG. 6 is a detailed circuit diagram of the oscillator 421 illustrated in FIG. 4.

Referring to FIG. 6, the oscillator 421 may be configured in the shape of a ring oscillator that includes a NOR gate 601 receiving the pump enable signal BBWEB and inverters 602 to 607.

If the 'high' pump enable signal BBWEB is input into the NOR gate 601, the NOR gate 601 outputs a 'low' signal. On the other hand, if the 'low' pump enable signal BBWEB is input into the NOR gate 601, the NOR gate 601 serves as an inverter. Thus, the oscillator 421 outputs a periodic signal OSC through the inverters 602 to 607.

FIG. 7 is a circuit diagram of the pump controller 422 illustrated in FIG. 4. FIG. 8 is an operation timing diagram of the pump controller 422 illustrated in FIG. 4.

Referring to FIGS. 7 and 8, the pump controller 422 includes a plurality of NAND gates and a plurality of inverters, and outputs the control signals P1, P2, G1 and G2 that are used to control the charge pump 423. The control signals P1 and P2 are used to enable a pumping operation of the charge pump 423, and the control signals G1 and G2 are a kind of precharge signal.

FIG. 9 is a circuit diagram of the charge pump 423 illustrated in FIG. 4.

Referring to FIG. 9, the charge pump 423 serves to generate the negative voltage VBB trough a charge pumping operation. The charge pump 423 includes PMOS transistors 901, 902, 903 and 904. The PMOS transistor 901 operates as a capacitor in response to the control signal P1 that is applied to a node to which its source and drain are connected. The PMOS transistor 902 operates as a capacitor in response to the control signal P2 that is applied to a node to which its source and drain are connected. The PMOS transistor 903 operates as a capacitor in response to the control signal G1 that is applied to a node to which its source and drain are connected. The PMOS transistor 904 operates as a capacitor in response to the control signal G2 that is applied to a node to which its source and drain are connected.

In operation, the control signals P1 and P2 are applied to pump the negative voltage VBB, and the control signals G1 and G2 are applied to change the potential of nodes 'a' and 'b' into the ground voltage VSS.

FIG. 10 is a block diagram of a conventional circuit for generating a high voltage VPP that is higher than a supply voltage VDD.

Referring to FIG. 10, a conventional high voltage generator circuit includes: a high voltage detector 1010 configured to detect the level of a high voltage VPP and to output a pump enable signal PPES if the level of the high voltage VPP is not sufficiently low; and a high voltage pump 1020 configured to pump the high voltage VPP in response to the pump enable signal PPES output from the high voltage detector 1010.

The high voltage detector 1010 detects the level of a high voltage VPP, and outputs a pump enable signal PPES that is used to determine whether to drive the high voltage pump 1020. The high voltage pump 1020 pumps the high voltage VPP in response to the pump enable signal PPES output from the high voltage detector 1010. The high voltage pump 1020 includes oscillator 1021, a pump controller 1022, and a charge pump 1023.

The oscillator 1021 receives the pump enable signal PPES and outputs a periodic signal OSC. The pump controller 1022 outputs pump control signals P1, P2, G1 and G2 in response to the periodic signal OSC output from the oscillator 1021. The charge pump 1023 outputs a high voltage VPP in response to the pump control signals P1, P2, G1 and G2 output from the pump controller 1022.

In the overall operation, if the level of the high voltage VPP detected by the high voltage detector 1010 is sufficiently high (i.e., PPES Disable), the high voltage pump 1020 stops a pumping operation. On the other hand, if the level of the high voltage VPP detected by the high voltage detector 1010 is low (i.e., PPES Enable), the high voltage pump 1020 pumps the high voltage VPP.

The high voltage generator circuit of FIG. 10 generates the high voltage VPP through a charge pumping operation and thus is similar to the negative voltage generator circuit of FIG. 4 in terms of operation and configuration.

FIG. 11 is a circuit diagram of the high voltage detector 1010 illustrated in FIG. 10.

Referring to FIG. 11, the high voltage detector 1010 divides the high voltage VPP fed back from the charge pump 1023, and detects the level of the high voltage VPP through comparison with a reference voltage VREFP. If the level of the high voltage VPP decreases below a target level, the voltage level of a node C decreases below the reference voltage VREFP. Then, a transistor N02 forming a current mirror is turned on more strongly than a transistor N01, so that the logic level of a node D becomes 'low'. Thus, an inverter 1101 outputs the high-level pump enable signal PPES, so that the high voltage VPP is pumped.

On the other hand, if the level of the high voltage VPP is higher than the target level, the voltage level of the node C becomes higher than the reference voltage VREFP. In this case, the logic level of a node D becomes 'high'. Thus, the inverter 1101 outputs the low-level pump enable signal PPES, so that the high voltage pumping operation is stopped.

The reference voltage VREFP may be generated using a reference voltage generator circuit as illustrated in FIG. 1. The reference voltage VREFP may also be generated using other techniques, for example, by voltage division of the supply voltage VDD.

FIG. 12 is a detailed circuit diagram of the oscillator 1021 illustrated in FIG. 10.

Referring to FIG. 12, the oscillator 1021 may be configured in the shape of a ring oscillator that includes a NAND gate 1201 receiving the pump enable signal PPES and inverters 1202 to 1207. Both of the oscillator 1021 of FIG. 12 and the oscillator 421 of FIG. 6 have the shape of a ring oscillator. However, since the pump enable signal PPES is activated to 'high' unlike the pump enable signal BBWEB, the oscillator 1021 uses the NAND gate 1201 instead of the NOR gate 601.

If the 'low' pump enable signal PPES is input into the NAND gate 1201, the NAND gate 1201 outputs a 'low' signal. On the other hand, if the 'high' pump enable signal PPES is input into the NAND gate 1201, the NAND gate 1201 serves as an inverter. Thus, the oscillator 1021 outputs a periodic signal OSC through the inverters 1202 to 1207.

FIG. 13 is a circuit diagram of the pump controller 1022 illustrated in FIG. 10. FIG. 14 is an operation timing diagram of the pump controller 1022 illustrated in FIG. 10.

Referring to FIGS. 13 and 14, the pump controller 1022 includes a plurality of NAND gates and a plurality of inverters, and outputs the control signals P1, P2, G1 and G2 that are used to control the charge pump 1023. The control signals P1 and P2 are used to enable a pumping operation of the charge pump 1023, and the control signals G1 and G2 are a kind of precharge signal.

The timing of generating the control signals P1, P2, G1 and G2 according to the periodic signal OSC is illustrated in FIG. 14, and the timing of FIG. 14 is slightly different from the timing of FIG. 8 because not the negative voltage VBB but the high voltage VPP is pumped.

FIG. 15 is a circuit diagram of the charge pump 1023 illustrated in FIG. 10.

Referring to FIG. 15, the charge pump 1023 serves to pump the high voltage VPP. The charge pump 1023 includes NMOS transistors 901, 902, 903 and 904. The NMOS transistor 1501 operates as a capacitor in response to the control signal P1 that is applied to a node to which its source and drain are connected. The NMOS transistor 1502 operates as a capacitor in response to the control signal P2 that is applied to a node to which its source and drain are connected. The NMOS transistor 1503 operates as a capacitor in response to the control signal G1 that is applied to a node to which its source and drain are connected. The NMOS transistor 1504 operates as a capacitor in response to the control signal G2 that is applied to a node to which its source and drain are connected.

In operation, the control signals P1 and P2 are applied to pump the high voltage VPP, and the control signals G1 and G2 are applied to change the potential of nodes 'e' and 'f' into the ground voltage VSS.

FIG. 16 is a circuit diagram of a conventional internal voltage generator circuit using a down-converting technique.

An example of an internal voltage generated using a down-converting technique is a core voltage VCORE used in a core region of a semiconductor memory device. Hereinafter, a description will be given of a core voltage (VCORE) generator circuit.

Referring to FIG. 16, a conventional core voltage generator circuit includes a differential amplifier 1610, a driver 1620, and a voltage divider 1630. The differential amplifier 1610 is configured to receive a fed-back core voltage VCORE_FEED and a reference voltage VREFC to output a driver control signal DET. The driver 1620 is configured to drive a core voltage VCORE in response to the driver control signal DET. The voltage divider 1630 is configured to divide the core voltage VCORE to generate the fed-back core voltage VCORE_FEED.

As illustrated in FIG. 16, the differential amplifier 1610 may be constructed to include an operational amplifier (OP Amp). The driver 1620 may be constructed to include a PMOS transistor that drives the core voltage VCORE in response to the driver control signal DET. The voltage divider 1630 may be constructed to include diode-connected transistors that divide the core voltage VCORE to generate the fed-back core voltage VCORE_FEED.

When the circuit starts to operate, both terminals of the differential amplifier 1610 has the same voltage and thus VCORE_FEED=VREFC. Then, a voltage, which is higher than the reference voltage VREFC and lower than a supply voltage VDD, is output as the core voltage VCORE depending on the resistance ratio of the diode-connected transistors.

A variety of internal voltage generator circuits described above are used in a variety of semiconductor devices to generate internal voltages that are different in level from the supply voltage.

After manufactured, a semiconductor device does not operate at only one speed. The operation speed (e.g., clock frequency) of a semiconductor device may vary depending on the type of a system using the semiconductor device. Moreover, the operation speed of a semiconductor device may vary according to circumstances even when the semiconductor device is used in one system.

The power consumption of a semiconductor device differs depending on the operation speed of the semiconductor device. In general, the power consumption of a semiconductor device increases with an increase in the operation speed of the semiconductor device, and decreases with a decrease in the operation speed of the semiconductor device. Thus, the levels of the internal voltages used in a semiconductor device needs to be changed depending on the operation speed of the semiconductor device.

For example, the power consumption of a semiconductor device increases as the clock frequency of the semiconductor device increases. In this case, the level of an internal voltage decreases as the operation speed of the semiconductor device increases. The reason for this is that the stable power for an internal voltage generator circuit is difficult to achieve and the internal voltage is consumed more rapidly. This causes a timing loss in various circuits such as a bit line sense amplifier (BLSA), an input/output sense amplifier (IOSA), and a write driver that are sensitively affected by the on/off time of a transistor due to an internal voltage in a core region.

SUMMARY OF THE INVENTION

Embodiments of the present invention are directed to providing a semiconductor device including an internal voltage generator circuit that provides an internal voltage having a different level depending on the operation speed.

In accordance with an aspect of the invention, there is provided a semiconductor device, comprising an internal voltage generator circuit configured to receive operation speed information to generate an internal voltage having a different level depending on the operation speed; and an internal circuit operated using the internal voltage.

And in accordance with another aspect of the invention, there is provided an internal voltage generator circuit, comprising a differential amplifier configured to output a driver control signal through receiving a feed-back of internal voltage and a reference voltage, a driver configured to drive an internal voltage in response to the driver control signal, and a voltage divider configured to divide the internal voltage to generate the feed-back of internal voltage, a division ratio of the internal voltage depending on operation speed information of a semiconductor device.

And in accordance with another aspect of the invention an internal voltage generator circuit, comprising a negative voltage detector configured to detect the level of a negative voltage to output an activated pump enable signal when the level of the negative voltage is not sufficiently low, wherein the level of the high voltage at which the pump enable signal is activated depending on operation speed information of a semiconductor device, and a negative voltage pump configured to generate the negative voltage in response to the pump enable signal.

And in accordance with another aspect of the invention an internal voltage generator circuit, comprising a high voltage detector configured to detect the level of a high voltage to output an activated pump enable signal when the level of the high voltage is not sufficiently high, the level of the negative, at which the pump enable signal is activated, depending on operation speed information of a semiconductor device, and a high voltage pump configured to generate the negative voltage in response to the pump enable signal.

DESCRIPTION OF SPECIFIC EMBODIMENTS

Hereinafter, an internal voltage generator and a semiconductor memory device including the same in accordance with the present invention will be described in detail with reference to the accompanying drawings.

Figure 17:
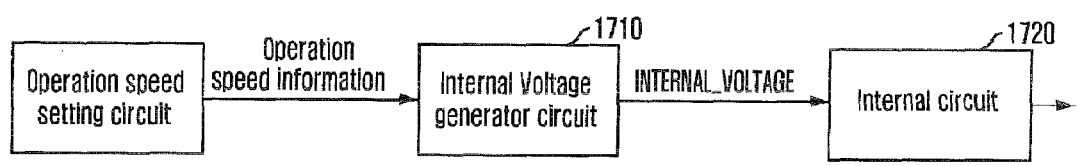
FIG. 17 is a block diagram of a semiconductor device in accordance with the present invention.

FIG. 17 is a block diagram of a semiconductor device in accordance with the invention.

Referring to FIG. 17, a semiconductor device in accordance with the invention includes an internal voltage generator circuit 1710 and an internal circuit 1720. The internal voltage generator circuit 1710 is configured to receive operation speed information of the semiconductor device to generate an internal voltage INTERNAL_VOLTAGE having a different level depending on the operation speed of the semiconductor device. The internal circuit 1720 operates according to the internal voltage INTERNAL_VOLTAGE.

Herein, the operation speed information of the semiconductor device means information about the current operation speed of the semiconductor device. In general, since a semiconductor device operates in synchronization with a clock, the operation speed information may be information about the current clock frequency. For example, if a signal A is activated when a semiconductor device operates at a speed of 100 MHz and a signal B is activated when the semiconductor device operates at a speed of 200 MHz, the signal A and the signal B becomes the operation speed information of the semiconductor device (The activation of the signal B means a higher speed than the activation of the signal A).

The CAS latency (CL) of a semiconductor memory device increases as the operation speed of the semiconductor memory device increases. Therefore, it can be said that the operation speed of a semiconductor device increases as a CAS latency (CL) value increases. Thus, signals CL9, CL11 and CL13 are activated when the CAS latency (CL) values of a semiconductor memory device are 9, 11 and 13, they may become the operation speed information (The activation of the signal CL13 means a higher speed than the activation of the signal CL9 or CL1).

In the case of a memory device, a clock is input/output but information about a clock frequency is not input/output. However, the CAS latency is set differently depending on the clock frequency, in consideration of an asynchronous operation in the memory device, so that the input/output such as other signal and data synchronizes with the input/output clock. Thus, information about the CAS latency (CL) can be used as the operation speed information as described above.

Figure 26:
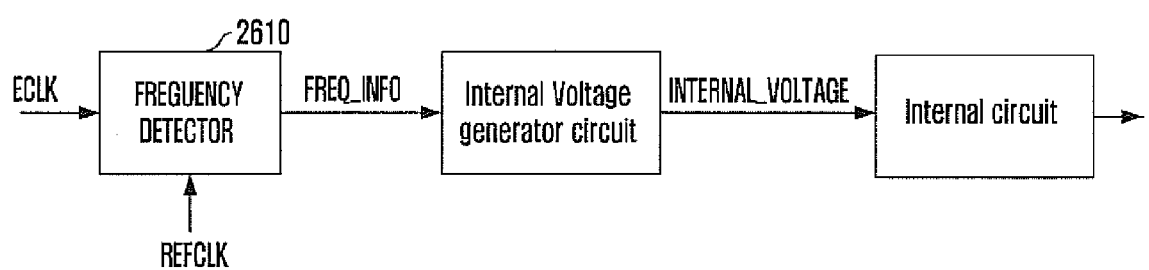
FIG. 26 is a block diagram of a semiconductor device in accordance with an exemplary embodiment of the present invention.

Referring to FIG. 26, a frequency detector 2610 may be used in a memory device to directly detect the frequency of an input/output clock in the memory device. The frequency detector 2610 is a circuit that compares an input/output external clock ECLK with an internal reference clock REFCLK to detect the frequency of the input/output external clock ECLK. Information FREQ_INFO detected by the frequency detector 2610 may be used as the operation speed information.

Also, in a variety of other semiconductor devices such as CPUs, information about the operation speed or the detection result of a frequency detector in the chip may be used as the operation speed information.

The invention is intended to change the level of an internal voltage INTERNAL_VOLTAGE according to a change in the operation speed of a semiconductor device that can operate at two or more speeds. Thus, an internal or external circuit is used to set the operation speed of a semiconductor device of the invention, and the above-described operation speed information may be generated from the internal or external circuit.

Since the CAS latency is determined by Mode Register Set (MRS) settings or Enhanced Mode Register Set (EMRS) settings, the operation speed information may be received from an MRS circuit or an EMRS circuit in a semiconductor memory device.

The internal voltage generator circuit 1710 receives the operation speed information of a semiconductor device to generate an internal voltage INTERNAL_VOLTAGE that has a different level depending on the operation speed. In general, the power consumption of a semiconductor device increases as the operation speed of the semiconductor device increases. Thus, as the operation speed of the semiconductor device increases, the internal voltage generator circuit 1710 generates an internal voltage INTERNAL_VOLTAGE having a stronger level. Herein, the stronger level means a higher level if the internal voltage INTERNAL_VOLTAGE is positive (i.e., 1.5 V is stronger than 1.2 V), and means a lower level if the internal voltage INTERNAL_VOLTAGE is negative (i.e., −1.5 V is stronger than −1.2 V).

It is generally preferably to generate an internal voltage INTERNAL_VOLTAGE with a stronger level as the operation speed of a semiconductor device increases. However, there is a case where an internal voltage INTERNAL_VOLTAGE with a weaker level is needed as the operation speed of a semiconductor device. The invention is intended to change the level of an internal voltage INTERNAL_VOLTAGE depending on the operation speed of a semiconductor device. Therefore, the invention may generate an internal voltage INTERNAL_VOLTAGE with a weaker level as the operation speed of the semiconductor device increases.

The voltage division ratio of the internal voltage generator circuit 1710 may be changed depending on the operation speed information of the semiconductor device, so that the internal voltage generator circuit 1710 can generate an internal voltage INTERNAL_VOLTAGE that has a different level depending on the operation speed information of the semiconductor device. Any type of internal voltage generator circuit 1710 performs voltage division at least one or more times to adjust the level of an internal voltage INTERNAL_VOLTAGE. The voltage division ratio may be changed depending on the operation speed information, so that it is possible to generate an internal voltage INTERNAL_VOLTAGE with a different level depending on the operation speed information.

The internal circuit 1720 operates according to the internal voltage INTERNAL_VOLTAGE generated by the internal voltage generator circuit 1710. Of course, the internal circuit 1720 differs depending on the type of an internal voltage INTERNAL_VOLTAGE that is generated by the internal voltage generator circuit 1710.

For example, if the semiconductor device of FIG. 17 is a semiconductor memory device, and if the internal voltage INTERNAL_VOLTAGE generated by the internal voltage generator circuit 1710 is a core voltage VCORE, the internal circuit 1720 may be a core region where memory cells are arranged densely. If the internal voltage INTERNAL_VOLTAGE generated by the internal voltage generator circuit 1710 is a high voltage VPP, the internal circuit 1720 may be a word line driver circuit (the high voltage VPP is used as a word line enable voltage). If the internal voltage INTERNAL_VOLTAGE generated by the internal voltage generator circuit 1710 is a negative voltage VBB, the internal circuit 1720 may be a word line driver circuit (the negative voltage VBB is used as a word line disable voltage). If the internal voltage INTERNAL_VOLTAGE generated by the internal voltage generator circuit 1710 is a reference voltage VREF, the internal circuit 1720 may be various circuits, such as a comparator, that use the reference voltage VREF.

Figure 18:
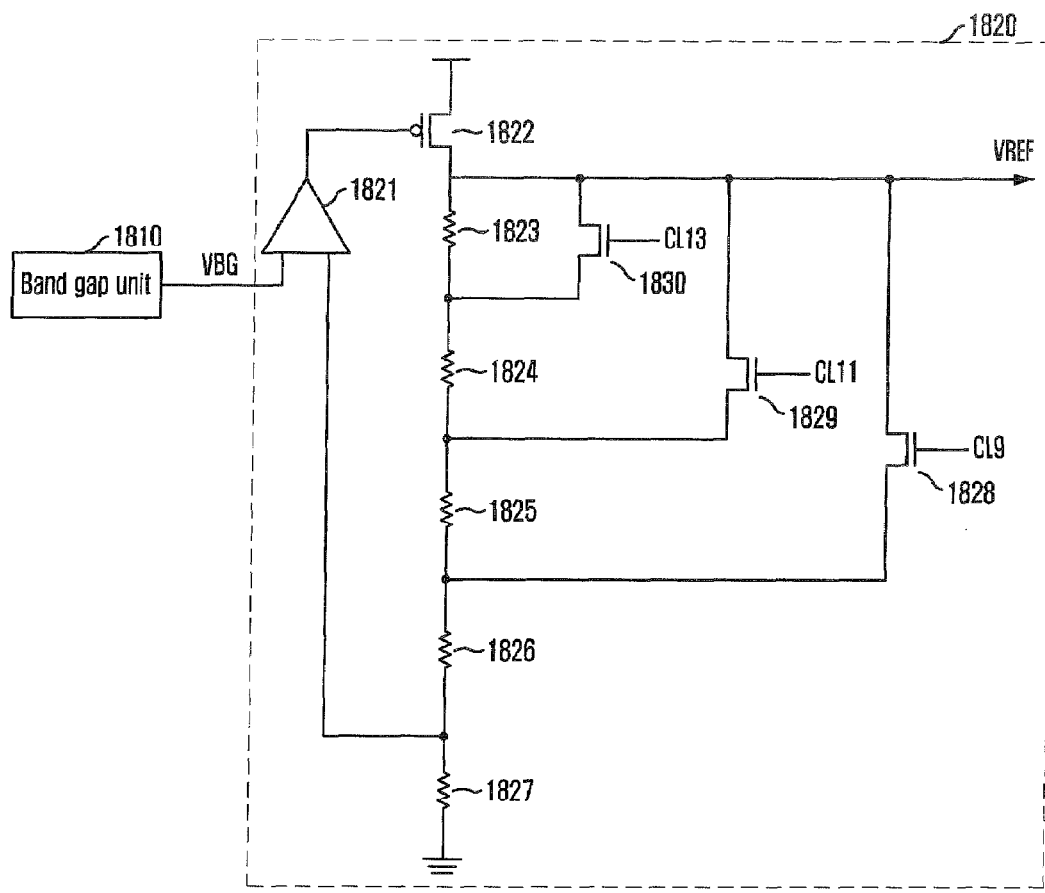
FIG. 18 is a circuit diagram of an internal voltage generator circuit for generating an internal voltage, which is used mainly as a reference voltage, in accordance with an embodiment of the invention.

FIG. 18 is a circuit diagram of an internal voltage generator circuit 1710 for generating an internal voltage, which is used mainly as a reference voltage, in accordance with an embodiment of the invention.

Referring to FIG. 18, an internal voltage generator circuit of the invention includes a band gap unit 1810 and a voltage divider 1820. The band gap unit 1810 is configured to output a band gap voltage VBG with a constant level that is independent of temperature. The voltage divider 1820 is configured to divide the band gap voltage VBG to output an internal voltage VREF. Herein, the voltage division ratio changes depending on operation speed information CL9, CL11 and CL13 of a semiconductor device.

Figure 1:
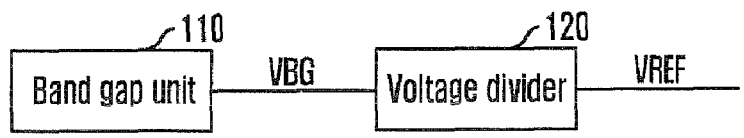
FIG. 1 is a block diagram of a conventional circuit for generating a reference voltage VREF.
Figure 2:
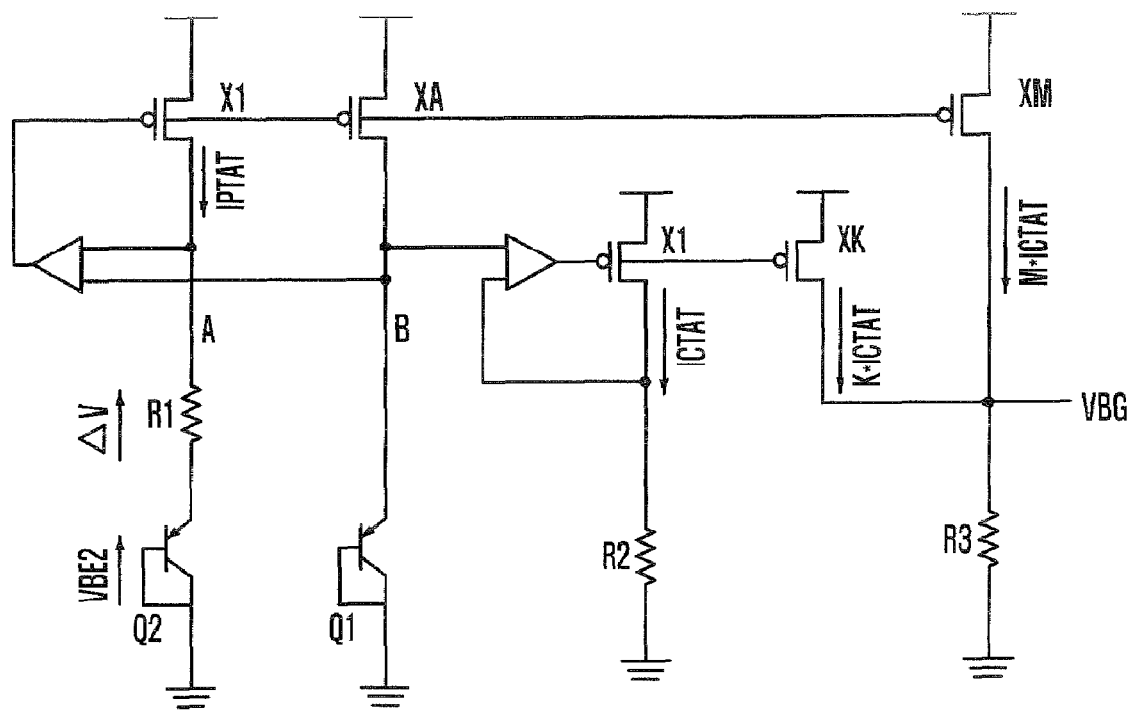
FIG. 2 is a circuit diagram of a band gap unit 110 illustrated in FIG. 1.
Figure 3:
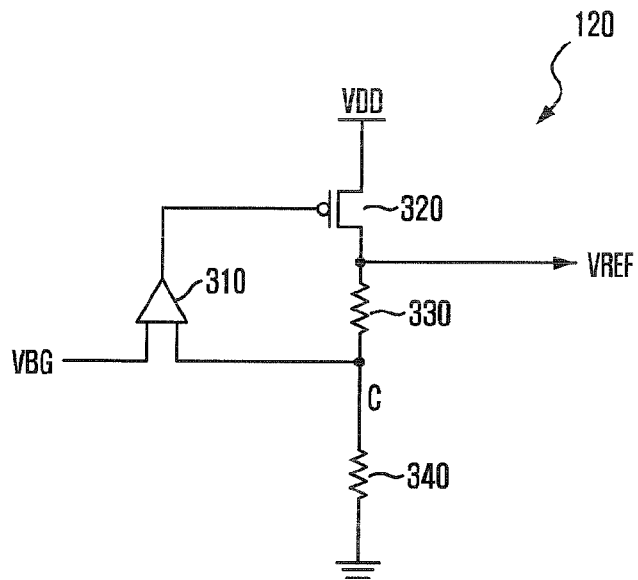
FIG. 3 is a circuit diagram of a voltage divider 120 illustrated in FIG. 1.

The band gap unit 1810 outputs a band gap voltage VBG that maintains a constant level even when the internal temperature of the semiconductor device changes. The band gap unit has been described in detail in BACKGROUND OF THE INVENTION with reference to FIG. 2, and thus its description will be omitted for conciseness.

The band gap unit 1810 divides the band gap voltage VBG to output a voltage with an adjusted level as the internal voltage VREF. The voltage divider 1820 includes a plurality of voltage divider units 1823, 1824, 1825, 1826 and 1827 that are configured to divide the band gap voltage VBG. Herein, and at least one or more of the voltage divider units 1823, 1824, 1825, 1826 and 1827 are electrically shorted or opened depending on the operation speed information CL9, CL11 and CL13. Thus, the voltage division ratio can change depending on the operation speed information CL9, CL11 and CL13, and the level of the internal voltage VREF can change with a change in the voltage division ratio. The voltage divider units 1823, 1824, 1825, 1826 and 1827 may be resistors as illustrated in FIG. 18, or may be diode-connected transistors.

If the operation speed is low, i.e., if a signal CL9 is activated, a transistor 1828 is turned on to electrically short both terminals of each of the resistors 1823, 1824 and 1825. Thus, the level of the internal voltage VREF becomes relatively low.

If a signal CL11 is activated, a transistor 1829 is turned on to electrically short both terminals of each of the resistors 1823 and 1824. In this case, since the resistor 1825 functions as a resistor, the level of the internal voltage VREF becomes relatively high in comparison with the case where the signal CL9 is activated.

If a signal CL13 is activated, a transistor 1830 is turned on to electrically short both terminals of the resistors 1823. In this case, since the resistors 1823 and 1825 functions as resistors, the level of the internal voltage VREF becomes relatively high in comparison with the above case where the signal CL9 or CL11 is activated.

That is, the level of the internal voltage VREF increases as the operation speed of the semiconductor device increases. If the signals CL9 and CL13 are input in the opposite order to FIG. 18, it is possible to decrease the level of the final internal voltage VREF as the operation speed of the semiconductor device increases.

The above embodiment exemplifies the case where the signals CL9, CL11 and CL13 representing CAS latency (CL) values are used as the operation speed information of the semiconductor device. This, however, is merely illustrative, and various signals representing various operation speeds, such as clock frequency signals of the semiconductor device, may be used instead of the signals CL9, CL11 and CL13 representing CAS latency (CL) values. For example, a signal A generated when the clock frequency is approximately 100 MHz, a signal B generated when the clock frequency is approximately 200 MHz, and a signal c generated when the clock frequency is approximately 300 MHz may be used instead of the signals CL9, CL11 and CL13.

The following embodiments exemplify the case where the signals CL9, CL11 and CL13 representing CAS latency (CL) values are used as the operation speed information of the semiconductor device. However, the signals A, B and C representing the operation speed (clock frequency) may be used instead of the signals CL9, CL11 and CL13.

The internal voltage VREF output from the voltage divider 1820 is an internal voltage VREF that is generated using a band gap voltage VBG that maintains a constant level even when a temperature change occurs. Therefore, the internal voltage VREF output from the voltage divider 1820 is mainly used as a reference voltage in the semiconductor device. Of course, the internal voltage VREF output from the voltage divider 1820 may also be used as other types of internal voltages, not the reference voltage.

Figure 19:
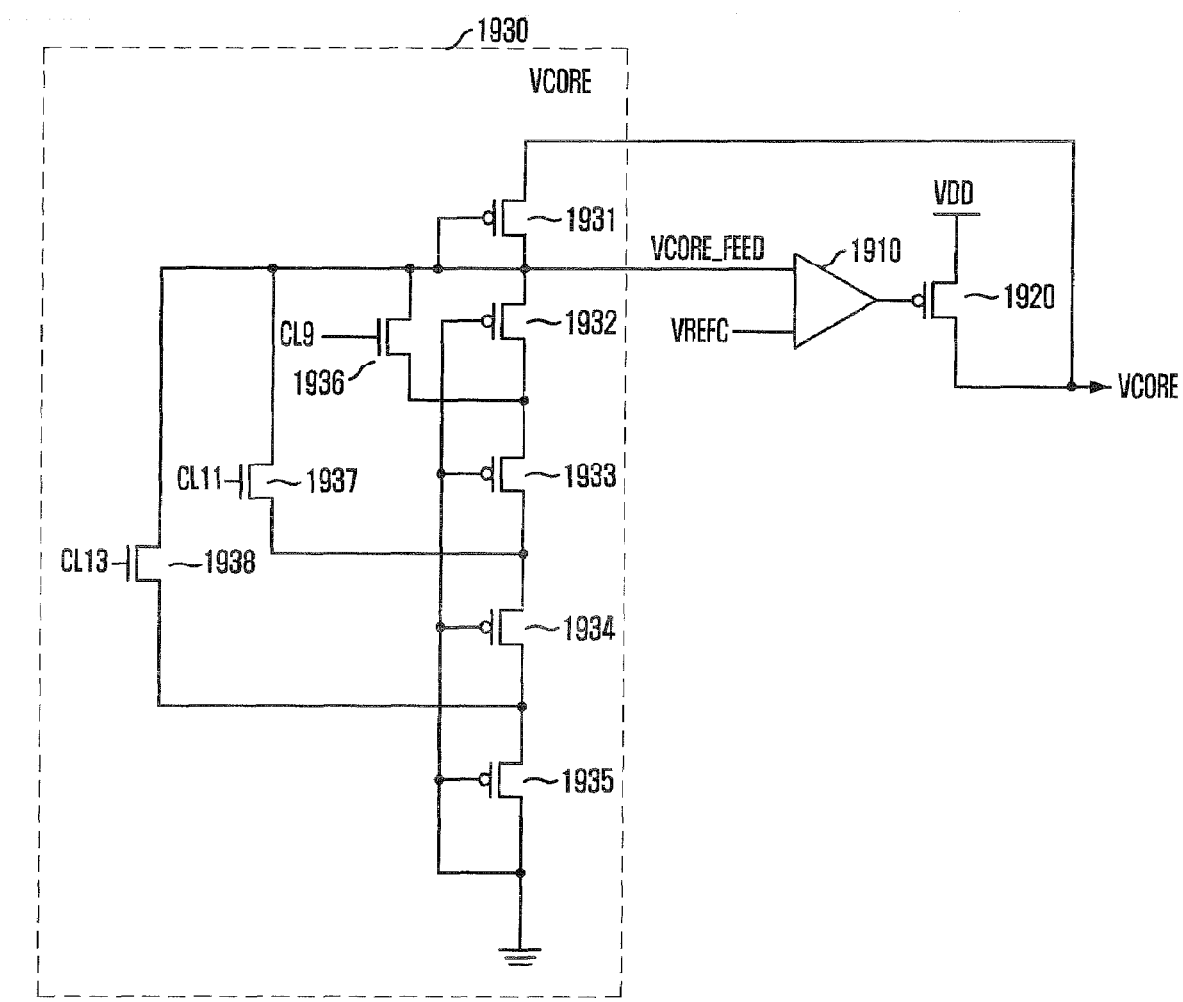
FIG. 19 is a circuit diagram of an internal voltage generator circuit for generating an internal voltage using a down-converting technique in accordance with an embodiment of the invention.

FIG. 19 is a circuit diagram of an internal voltage generator circuit 1710 for generating an internal voltage using a down-converting technique in accordance with an embodiment of the invention.

Referring to FIG. 19, the internal voltage generator circuit 1710 of the invention includes a differential amplifier 1910, a driver 1920, and a voltage divider 1930. The differential amplifier 1910 is configured to receive a fed-back internal voltage VCORE_FEED and a reference voltage VREFC to output a driver control signal DET. The driver 1920 is configured to drive an internal voltage VCORE in response to the driver control signal DET. The voltage divider 1930 is configured to divide the internal voltage VCORE, which is driven by the driver 1920, to generate the fed-back internal voltage VCORE_FEED. Herein, the voltage division ratio changes depending on the operation speed information CL9, CL11 and CL13 of the semiconductor device.

Figure 6:
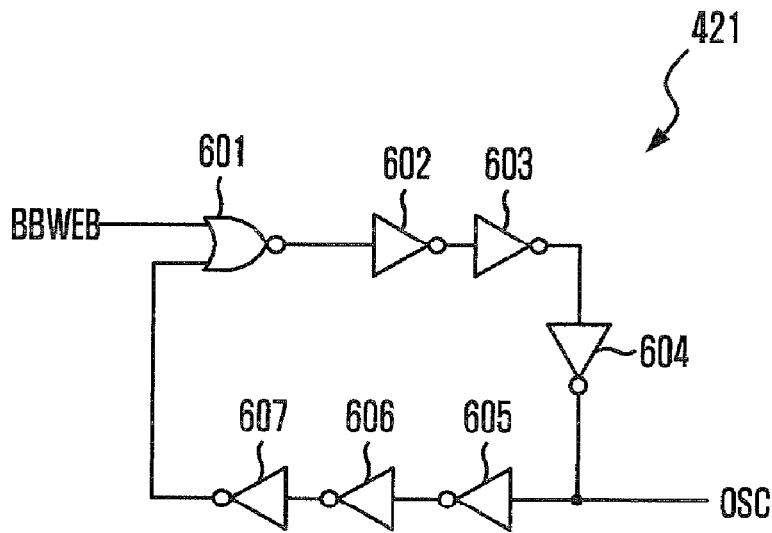
FIG. 6 is a detailed circuit diagram of an oscillator 421 illustrated in FIG. 4.
Figure 7:
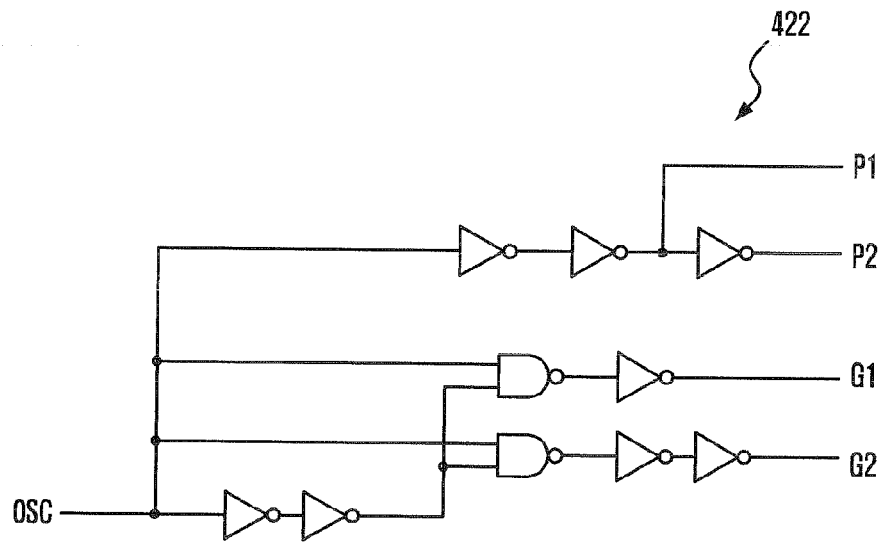
FIG. 7 is a circuit diagram of a pump controller 422 illustrated in FIG. 4.
Figure 8:
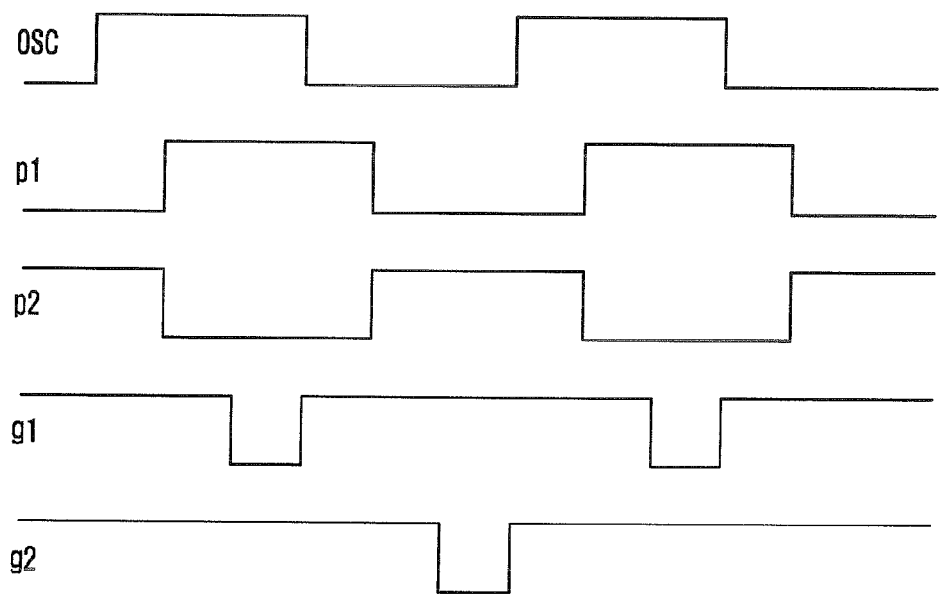
FIG. 8 is an operation timing diagram of the pump controller 422 illustrated in FIG. 4.
Figure 9:
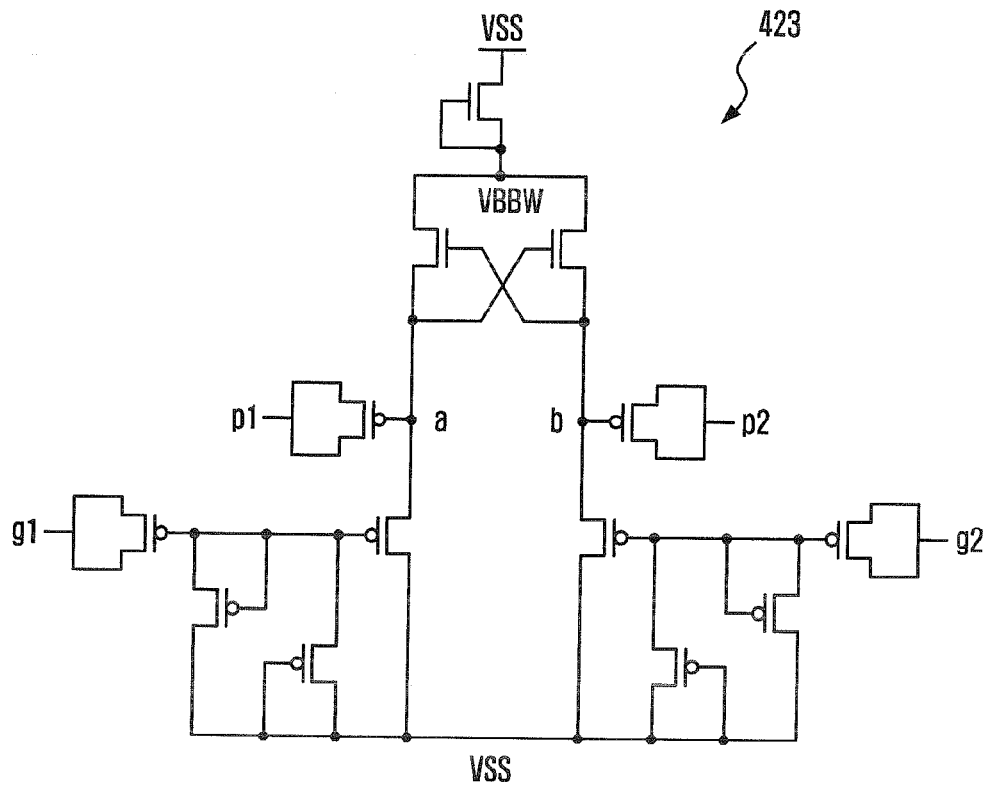
FIG. 9 is a circuit diagram of a charge pump 423 illustrated in FIG. 4.

The basic configuration and operation of the internal voltage generator circuit has been described in BACKGROUND OF THE INVENTION with reference to FIG. 6, and thus only the difference from the conventional internal voltage generator circuit will be described herein.

The conventional voltage divider 1630 divides the internal voltage VREF at a fixed ratio to provide the fed-back internal voltage VCORE_FEED to the differential amplifier 1610. On the other hand, the voltage divider 1930 of the invention changes the voltage division ratio depending on the operation speed information CL9, CL11 and CL13. Therefore, the ratio of the fed-back internal voltage VCORE_FEED to the internal voltage VCORE changes depending on the operation speed of the semiconductor device, and thus the level of the final internal voltage VCORE changes depending on the operation speed of the semiconductor device.

The voltage divider 1930 includes a plurality of voltage divider units 1931, 1932, 1933, 1934 and 1935 that are configured to divide the internal voltage VCORE to generate the fed-back internal voltage VCORE_FEED. Herein, at least one or more of the voltage divider units 1931, 1932, 1933, 1934 and 1935 are electrically shorted or opened depending on the operation speed information CL9, CL11 and CL13. The voltage divider units 1931, 1932, 1933, 1934 and 1935 may be diode-connected transistors as illustrated in FIG. 19, or may be resistors.

If the operation speed is low, i.e., if a signal CL9 is activated, a transistor 1936 is turned on to electrically short both terminals of the diode-connected transistor 1932. Thus, the diode-connected transistor 1932 does not participate in the voltage division, but the other diode-connected transistors 1933 and 1934 still participate in the voltage division. Thus, the level of the fed-back internal voltage VCORE_FEED becomes relatively high (in comparison with the level of the internal voltage VREF).

If a signal CL11 is activated, the diode-connected transistors 1932 and 1933 do not participate in the voltage division. Therefore, the level of the fed-back internal voltage VCORE_FEED becomes low in comparison with the case where the signal CL9 is activated (in comparison with the level of the internal voltage VREF).

If a signal CL13 is activated, the diode-connected transistors do not participate in the voltage division. Thus, the level of the fed-back internal voltage VCORE_FEED becomes lower in comparison with the case where the signal CL9 or CL11 is activated (in comparison with the level of the internal voltage VREF).

That is, as the operation speed of the semiconductor device increases, the fed-back internal voltage VCORE_FEED becomes lower than the internal voltage VREF. For example, VCORE_FEED=VCORE/2 if the operation speed is low, and VCORE_FEED=VCORE/3 if the operation speed is high. Thus, the level of the final internal voltage increases as the operation speed of the semiconductor device increases.

If the signals CL9 and CL13 are input in the opposite order to FIG. 18, it is possible to decrease the level of the final internal voltage VCORE as the operation speed of the semiconductor device increases.

The internal voltage generator circuit using the down-converting technique as illustrated in FIG. 19 is used to generate an internal voltage that is lower than the supply voltage VDD. In particular, the down-converting technique is mainly used to generate a core voltage VCORE that is used in a core region of a semiconductor memory device. For this reason, VCORE is exemplified as the reference symbol of the internal voltage.

Figure 20:
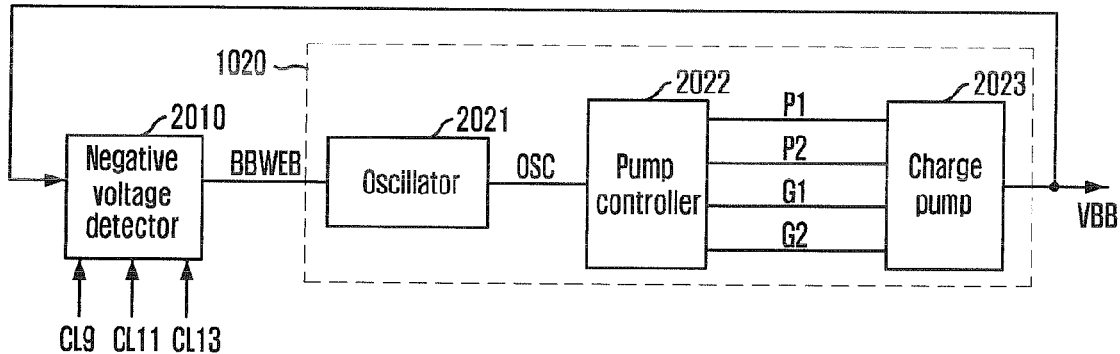
FIG. 20 is a circuit diagram of an internal voltage generator circuit for generating a negative voltage, which has a lower level than a ground voltage, in accordance with an embodiment of the invention.

FIG. 20 is a circuit diagram of an internal voltage generator circuit 1710 for generating a negative voltage, which has a lower level than a ground voltage, in accordance with an embodiment of the invention.

Referring to FIG. 20, an internal voltage generator circuit 1710 in accordance with an embodiment of the invention includes: a negative voltage detector 2010 and a negative voltage pump 2020. The negative voltage detector 2010 is configured to detect the level of a negative voltage VBB to output an activated pump enable signal BBWEB when the level of the negative voltage VBB is not sufficiently low. Herein, the level of the negative, at which the pump enable signal BBWEB is activated, changes depending on operation speed information of a semiconductor device. The negative voltage pump 2020 is configured to generate the negative voltage VBB in response to the pump enable signal BBWEB.

Figure 4:
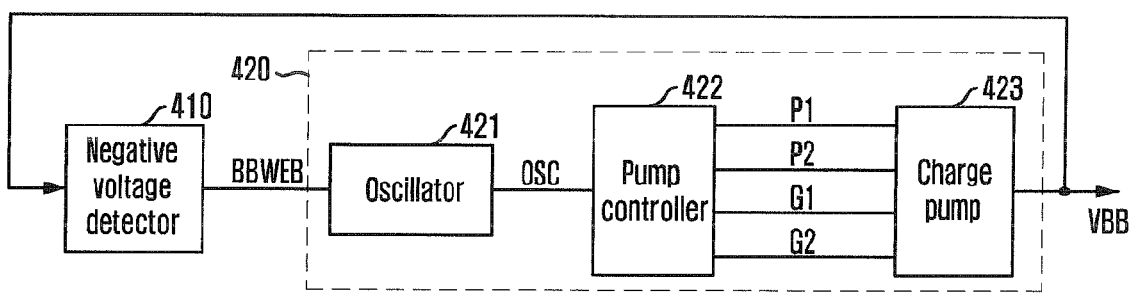
FIG. 4 is a block diagram of a conventional circuit for generating a negative voltage VBB that has a lower level than a ground voltage VSS.
Figure 5:
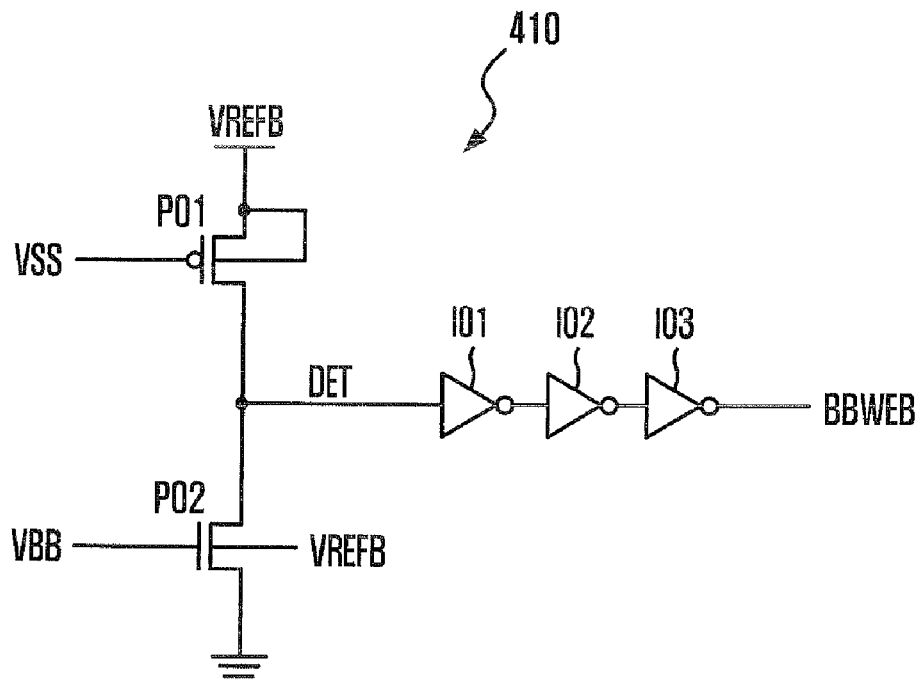
FIG. 5 is a circuit diagram of a negative voltage detector 410 illustrated in FIG. 4.

The negative voltage detector 2010 detects the level of a negative voltage VBB, and outputs an activated pump enable signal BBWEB that is used to pump the negative voltage VBB when the level of the negative voltage VBB is not sufficiently low. In the conventional negative voltage detector 410 (see FIG. 4), a pump enable signal BBWEB is activated when the level of a negative voltage VBB is higher than a predetermined level. However, in the negative voltage detector 2010 of the invention, the level of the negative voltage VBB, at which the pump enable signal BBWEB is activated, changes depending on operation speed information CL9, CL11 and CL13 of the semiconductor device. For example, if the operation speed is low, the pump enable signal BBWEB is activated when the level of the negative VBB voltage is higher than approximately −0.5 V. On the other hand, if the operation speed is high, the pump enable signal BBWEB is activated when the level of the negative voltage VBB is higher than approximately −0.8 V.

When the level of the negative voltage VBB, at which the pump enable signal BBWEB starts to be activated, changes depending on the operation speed, it is possible to change the level of the negative voltage VBB generated by the negative voltage pump 2020. For example, if the operation speed is low and thus the pump enable signal BBWEB is activated only when the level of the negative VBB voltage is higher than approximately −0.5 V, the level of the negative voltage VBB also maintains approximately −0.5 V. On the other hand, if the operation speed is high and thus the pump enable signal BBWEB is activated only when the level of the negative VBB voltage is higher than approximately −0.8 V, the level of the negative voltage VBB also maintains approximately −0.8 V. The negative voltage detector 2010 will be described later in more detail with reference to FIG. 21.

When the pump enable signal BBEEB is activated, the negative voltage pump 2020 pumps the negative voltage VBB. When the pump enable signal BBEEB is deactivated, the negative voltage pump 2020 stops pumping the negative voltage VBB. Like the conventional negative voltage pump 420 (see FIG. 4), the negative voltage pump 2020 of the invention may include an oscillator 2021, a pump controller 2022, and a charge pump 2023. This has been described in detail in BACKGROUND OF THE INVENTION, and thus its more detailed description is not provided herein.

Figure 21:
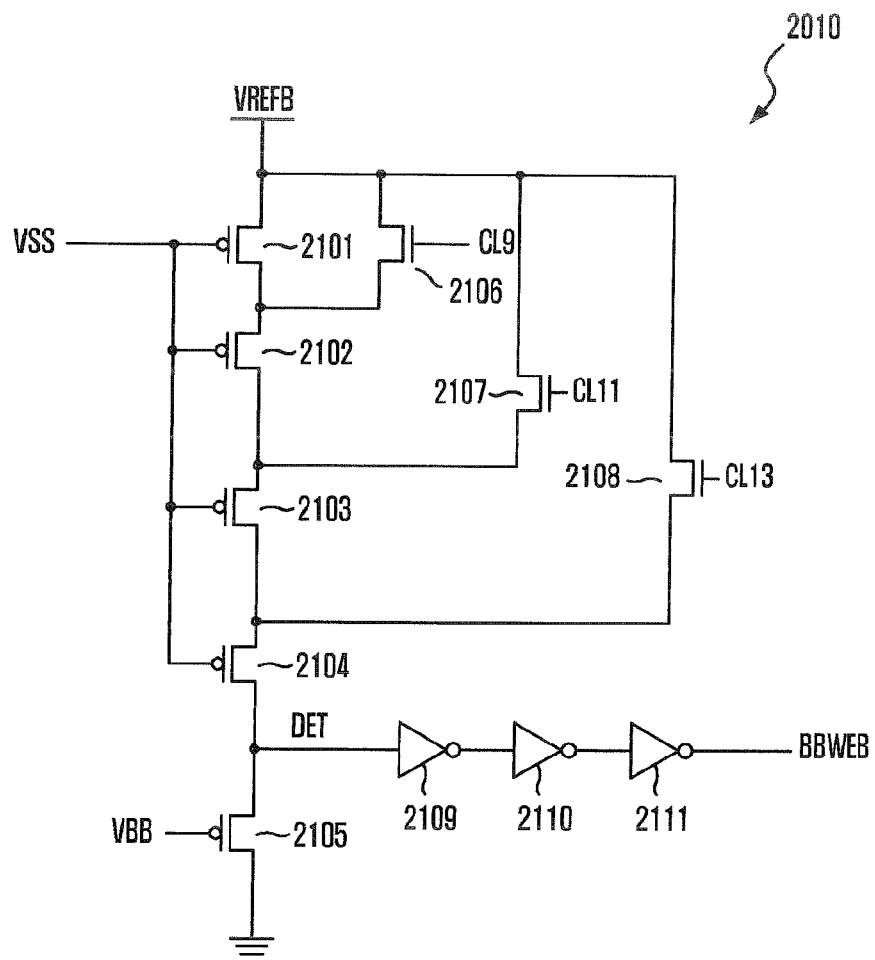
FIG. 21 is a circuit diagram of a negative voltage detector 2010 of FIG. 20 in accordance with an embodiment of the invention.

FIG. 21 is a circuit diagram of the negative voltage detector 2010 of FIG. 20 in accordance with an embodiment of the invention.

Referring to FIG. 21, the negative voltage detector 2010 includes a plurality of pull-up transistors 2101, 2102, 2103 and 2104 and a pull-down transistor 2105. The pull-up transistors 2101, 2102, 2103 and 2104 are configured to receive a ground voltage VSS through gates thereof to pull up a detection node DET. The pull-down transistor 2105 is configured to receive the negative voltage through a gate thereof to pull down the detection node. Herein, at least one or more of the pull-up transistors 2101, 2102, 2103 and 2104 are turned off or on depending on the operation speed information CL9, CL11 and CL13.

If the operation speed is high, i.e., if a signal CL13 is activated, a transistor 2108 is turned on to short both terminals of each of the pull-up transistors 2101, 2102 and 2103. Thus, the voltage level of the detection node DET becomes relatively high, which activates the pump enable signal BBWEB to a low level more easily. That is, the pump enable signal BBWEB is activated more easily in a medium-speed mode (CL11 Activated) than in a low-speed mode (CL9 Activated) (the pump enable signal BBWEB is deactivated when the level of the negative voltage VBB is very low).

If the operation speed is medium, i.e., if a signal CL11 is activated, a transistor 2107 is turned on to short both terminals of each of the pull-up transistors 2101 and 2102. Thus, the voltage level of the detection node DET becomes relatively low in comparison with the case when the signal CL13 is activated. However, the voltage level of the detection node DET becomes relatively high in comparison with the case when a signal CL9, which will be described later, is activated. The pump enable signal BBWEB is activated more difficultly than in a high-speed mode (CL13 Activated) and is activated more easily than in a low-speed mode (CL9 Activated) (the pump enable signal BBWEB is deactivated when the level of the negative voltage VBB is moderately low).

If the operation speed is low, i.e., if a signal CL9 is activated, a transistor 2106 is turned on to short both terminals of the pull-up transistor 2101. Thus, the voltage level of the detection node DET becomes relatively high in comparison with the above two cases. Thus, the pump enable signal BBWEB is not activated more easily than in the above two cases (the pump enable signal BBWEB is deactivated even when the level of the negative voltage VBB is high).

That is, when the signal CL9 is activated, the pump enable signal BBWEB is activated if the negative voltage VBB is higher than approximately −0.5 V. When the signal CL11 is activated, the pump enable signal BBWEB is activated if the negative voltage VBB is higher than approximately −0.7 V. When the signal CL13 is activated, the pump enable signal BBWEB is activated if the negative voltage VBB is higher than approximately −0.9 V.

The signals CL9 and CL13 may be input in the opposite order to the drawings so that the negative voltage detector 2010 has the opposite characteristics.

Figure 22:
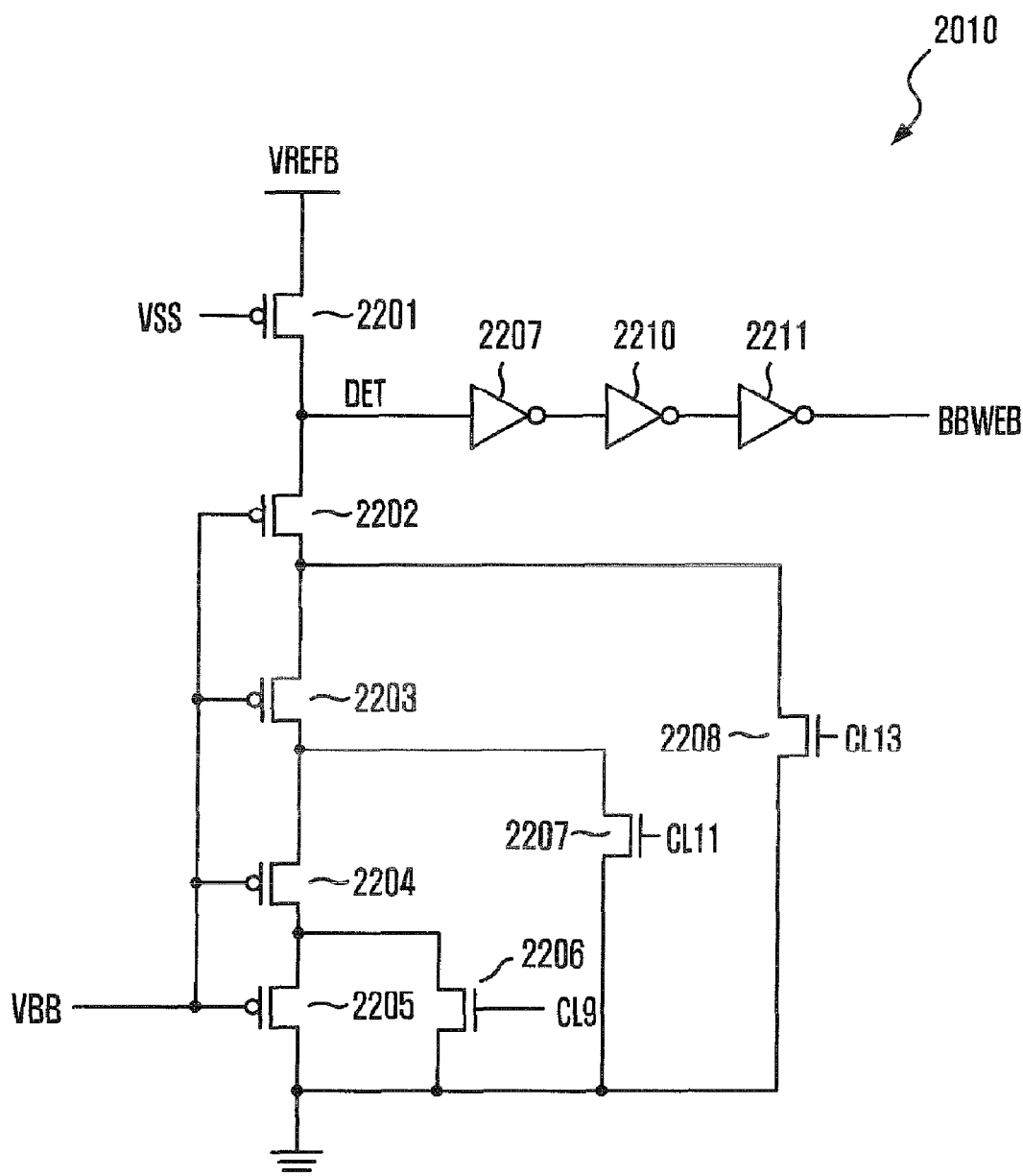
FIG. 22 is a circuit diagram of the negative voltage detector 2010 of FIG. 20 in accordance with another embodiment of the invention.

FIG. 22 is a circuit diagram of the negative voltage detector 2010 of FIG. 20 in accordance with another embodiment of the invention.

Referring to FIG. 22, the negative voltage detector 2010 includes a pull-up transistor 2201 and a plurality of pull-down transistors 2202, 2203, 2204 and 2205. The pull-up transistor 2201 is configured to receive a ground voltage VSS through a gate thereof to pull up a detection node DET. The pull-down transistors 2202, 2203, 2204 and 2205 are configured to receive the negative voltage VBB through gates thereof to pull down the detection node DET. Herein, at least one or more of the pull-down transistors 2202, 2203, 2204 and 2205 are turned off or on depending on the operation speed information CL9, CL11 and CL13.

The embodiment of FIG. 21 controls the turning off or on of the pull-up transistors 2101, 2102, 2103 and 2104 on the basis of the operation speed information CL9, CL11 and CL13. On the other hand, the embodiment of FIG. 22 controls the turning off or on of the pull-down transistors 2202, 2203, 2204 and 2205 on the basis of the operation speed information CL9, CL11 and CL13. Therefore, it is possible to change the level of the negative voltage VBB depending on the operation speed information. The embodiment of FIG. 22 is identical in operation to the embodiment of FIG. 21 with the exception that it controls the turning off or on of the pull-down transistors 2202, 2203, 2204 and 2205 instead of the pull-up transistors 2101, 2102, 2103 and 2104, and thus its more detailed description will be omitted for conciseness.

Figure 23:
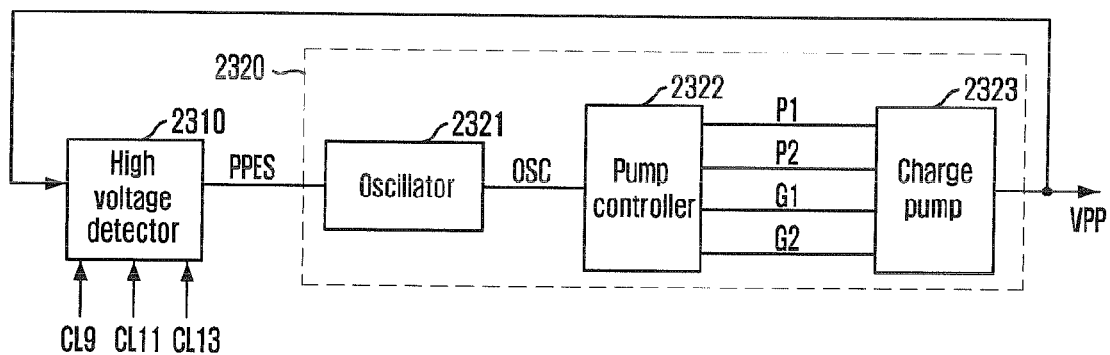
FIG. 23 is a circuit diagram of an internal voltage generator circuit for generating a high voltage, which has a higher level than a supply voltage, in accordance with an embodiment of the invention.

FIG. 23 is a circuit diagram of an internal voltage generator circuit 1710 for generating a high voltage, which has a higher level than a supply voltage, in accordance with an embodiment of the invention.

Referring to FIG. 23, an internal voltage generator circuit 1710 in accordance with an embodiment of the invention includes: a high voltage detector 2310 and a high voltage pump 2320. The high voltage detector 2310 is configured to detect the level of a high voltage VPP to output an activated pump enable signal PPES when the level of the high voltage VPP is not sufficiently high. Herein, the level of the negative, at which the pump enable signal PPES is activated, changes depending on operation speed information of a semiconductor device. The high voltage pump 2320 is configured to generate the high voltage VPP in response to the pump enable signal PPES.

Figure 10:
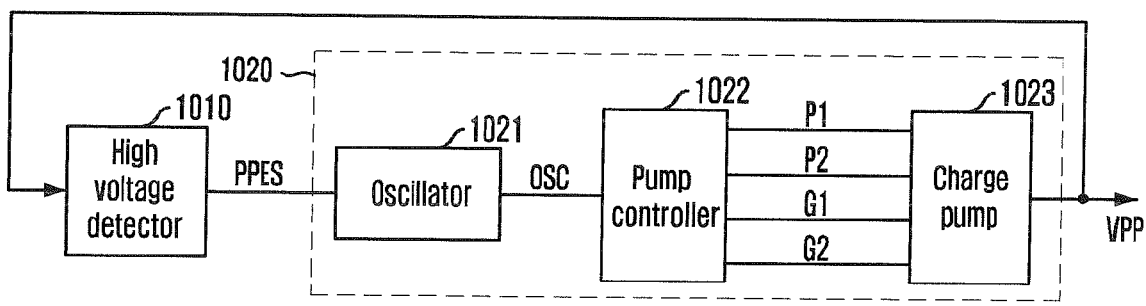
FIG. 10 is a block diagram of a conventional circuit for generating a high voltage VPP that is higher than a supply voltage VDD.
Figure 11:
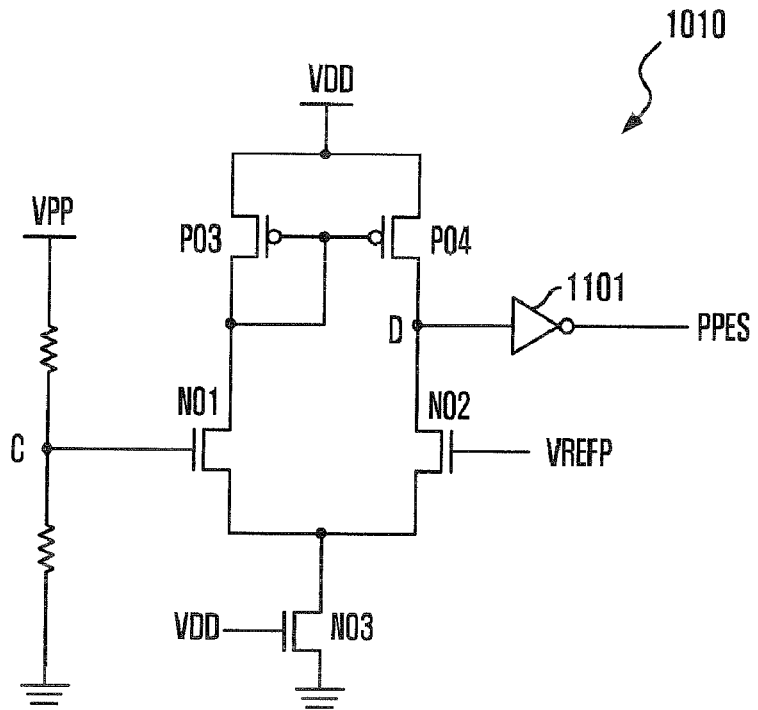
FIG. 11 is a circuit diagram of a high voltage detector 1010 illustrated in FIG. 10.
Figure 12:
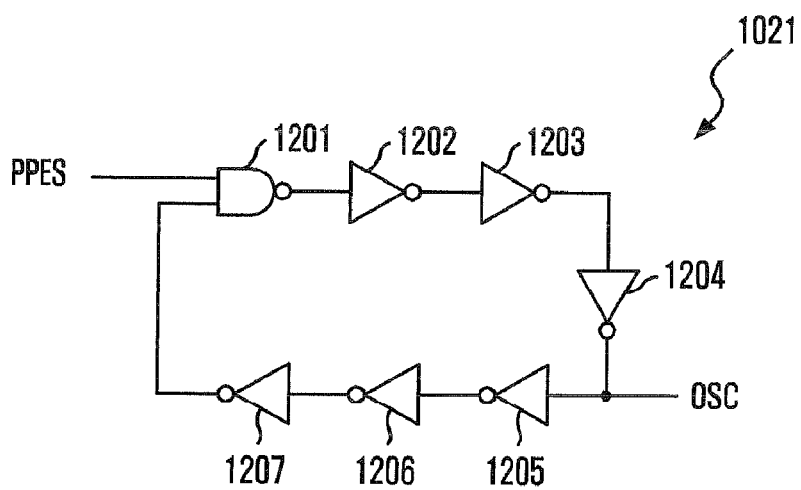
FIG. 12 is a detailed circuit diagram of an oscillator 1021 illustrated in FIG. 10.
Figure 13:
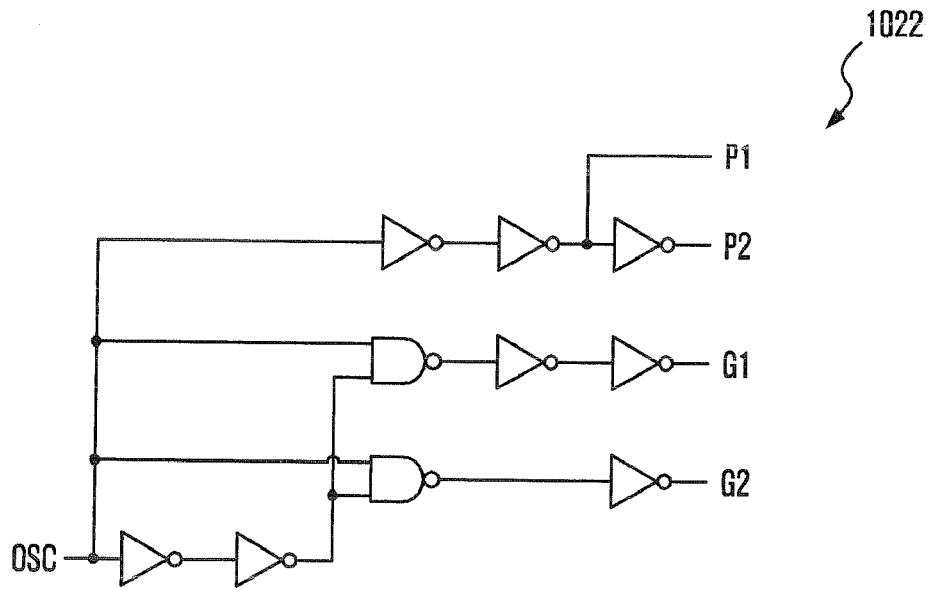
FIG. 13 is a circuit diagram of a pump controller 1022 illustrated in FIG. 10.
Figure 14:
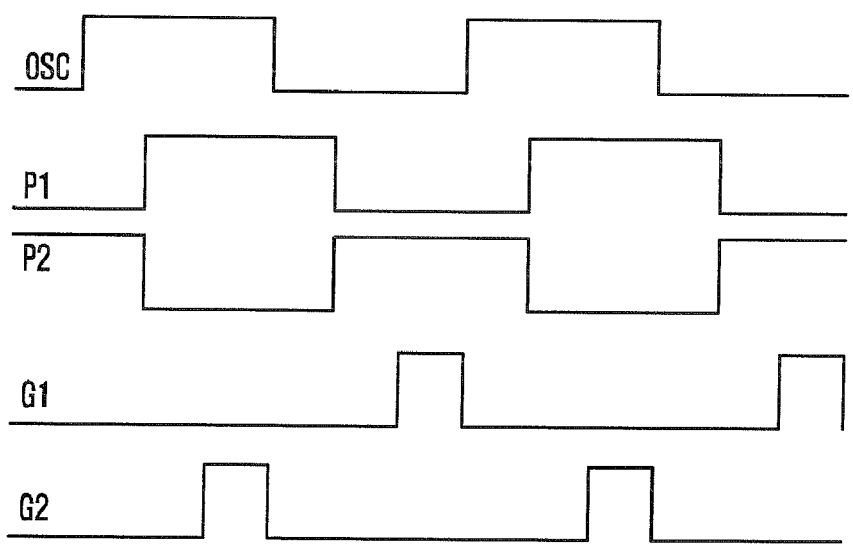
FIG. 14 is an operation timing diagram of the pump controller 1022 illustrated in FIG. 10.
Figure 15:
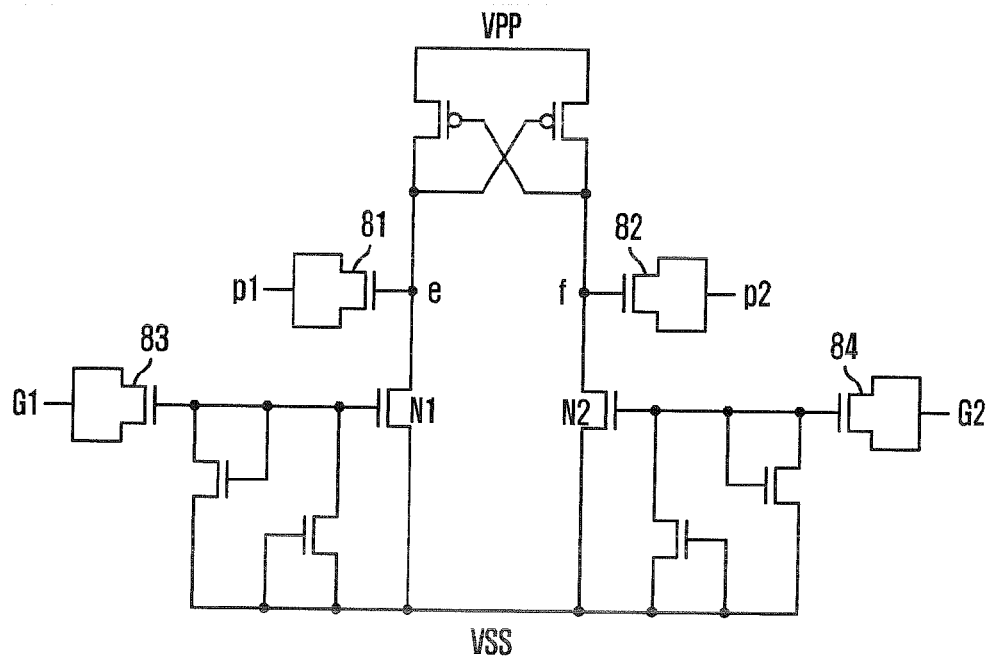
FIG. 15 is a circuit diagram of a charge pump 1023 illustrated in FIG. 10.
Figure 16:
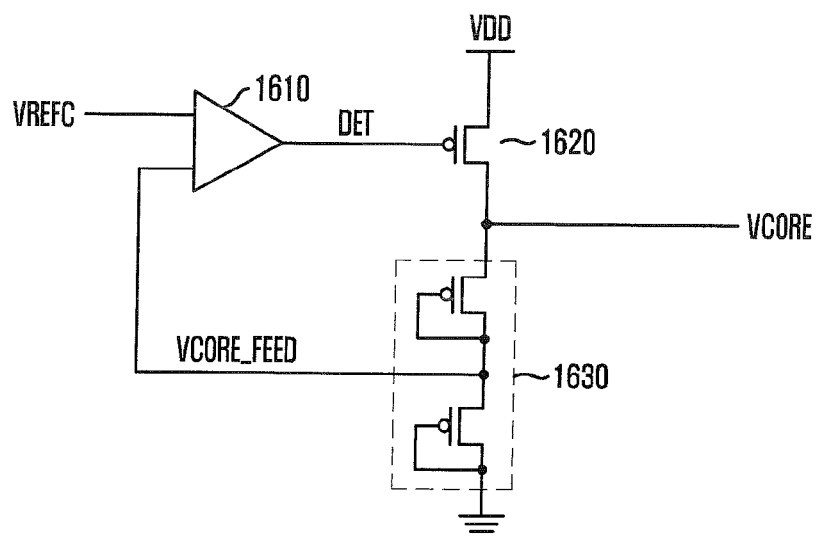
FIG. 16 is a circuit diagram of a conventional internal voltage generator circuit using a down-converting technique.

The high voltage detector 2310 detects the level of a high voltage VPP, and outputs an activated pump enable signal PPES that is used to pump the high voltage VPP when the level of the high voltage VPP is not sufficiently high. In the conventional high voltage detector 1010 (see FIG. 10), a pump enable signal PPES is activated when the level of a high voltage VPP is lower than a predetermined level. However, in the high voltage detector 2310 of the invention, the level of the high voltage VPP, at which the pump enable signal PPES is activated, changes depending on operation speed information CL9, CL11 and CL13 of the semiconductor device. For example, if the operation speed is low, the pump enable signal PPES is activated when the level of the negative VBB voltage is lower than approximately 1.5 V. On the other hand, if the operation speed is high, the pump enable signal PPES is activated when the level of the high voltage VPP is lower than approximately 2.0 V.

When the level of the high voltage VPP, at which the pump enable signal PPES starts to be activated, changes depending on the operation speed, it is possible to change the level of the high voltage VPP generated by the high voltage pump 2320. For example, if the operation speed is low and thus the pump enable signal PPES is activated only when the level of the negative VBB voltage is lower than approximately 1.5 V, the level of the high voltage VPP also maintains approximately 1.5 V. On the other hand, if the operation speed is high and thus the pump enable signal PPES is activated only when the level of the negative VBB voltage is lower than approximately 2.0 V, the level of the high voltage VPP also maintains approximately 2.0 V. The high voltage detector 2310 will be described later in more detail with reference to FIG. 24.

When the pump enable signal BBEEB is activated, the high voltage pump 2320 pumps the high voltage VPP. When the pump enable signal BBEEB is deactivated, the high voltage pump 2320 stops pumping the high voltage VPP. Like the conventional high voltage pump 1020 (see FIG. 10), the high voltage pump 2320 of the invention may include an oscillator 2321, a pump controller 2322, and a charge pump 2323. This has been described in detail in BACKGROUND OF THE INVENTION, and thus its more detailed description is not provided herein.

Figure 24:
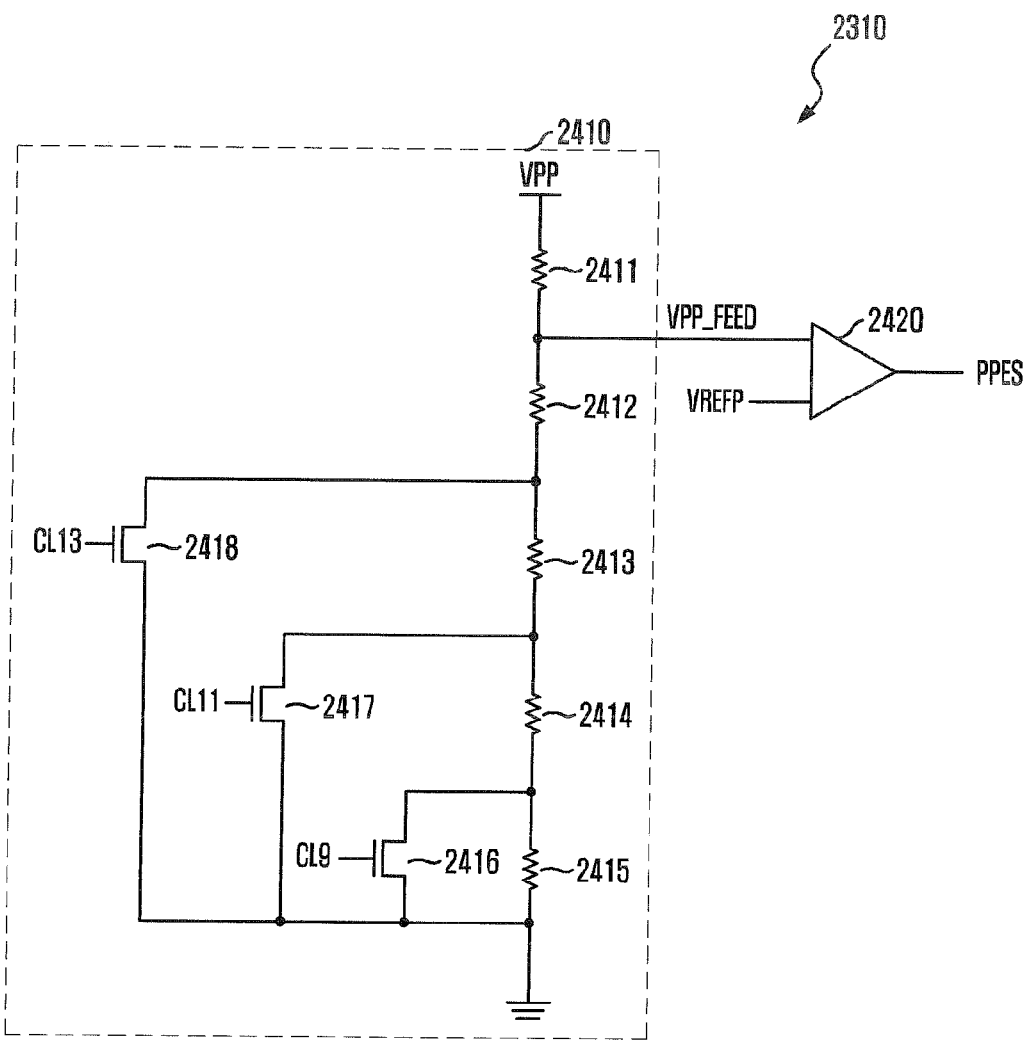
FIG. 24 is a circuit diagram of a high voltage detector 2310 of FIG. 23 in accordance with an embodiment of the invention.

FIG. 24 is a circuit diagram of the high voltage detector 2310 of FIG. 23 in accordance with an embodiment of the invention.

Referring to FIG. 24, the high voltage detector 2310 includes a voltage divider 2410 and a comparator 2420. The voltage divider 2410 is configured to divide a high voltage VPP to generate a feedback voltage VPP_FEED. Herein, the voltage division ratio changes depending on the operation speed information CL9, CL11 and CL13. The comparator 2420 is configured to compare the feedback voltage VPP_FEED with a reference voltage VREFP to output the pump enable signal PPES.

If the feedback voltage VPP_FEED is lower than the reference voltage VREFP, the comparator 2420 outputs an activated pump enable signal PPES. On the other hand, if the feedback voltage VPP_FEED is higher than the reference voltage VREFP, the comparator 2420 outputs a deactivated pump enable signal PPES.

The voltage divider 2410 includes a plurality of voltage divider units 2411, 2412, 2413, 2414 and 2415 that are configured to divide the high voltage VPP to generate the feedback voltage VPP_FEED. Herein, at least one or more of the voltage divider units 2411, 2412, 2413, 2414 and 2415 are electrically shorted or opened depending on the operation speed information CL9, CL11 and CL13. The voltage divider units 2411, 2412, 2413, 2414 and 2415 may be resistors as illustrated in FIG. 24, or may be diode-connected transistors.

If the operation speed is high and thus a signal CL13 is activated, a transistor 2418 is turned on to short both terminals of each of the resistors 2413, 2414 and 2415. Thus, the level of the feedback voltage VPP_FEED becomes considerably low, which activates the pump enable signal PPES more easily (the pump enable signal PPES is activated even when the level of the high voltage VPP is relatively high).

If the operation speed is low and thus a signal CL9 is activated, a transistor 2416 is turned on to short both terminals of only the resistor 2415. Thus, the level of the feedback voltage VPP_FEED becomes considerably high, which makes it difficult to activate the pump enable signal PPES (the pump enable signal PPES is activated only when the level of the high voltage VPP is low).

If the operation speed is medium and thus a signal CL11 is activated, the high voltage detector 2310 has intermediate characteristics between the above two cases.

As a result, as the operation speed increases, the high voltage detector 2310 of the invention activates the pump enable signal PPES only when the level of the high voltage VPP is higher. For example, when the operation speed is high, the pump enable signal PPES is deactivated only when the high voltage VPP is higher than approximately 2.0 V. When the operation speed is medium, the pump enable signal PPES is deactivated if the high voltage VPP is higher than approximately 1.7 V. When the operation speed is low, the pump enable signal PPES is deactivated if the high voltage VPP is higher than approximately 1.5 V.

The use of the high voltage detector 2310 makes it possible to increase the level of the high voltage VPP as the operation speed of the semiconductor device increases.

The signal CL9 and CL13 may be input in the opposite order to the drawings so that the level of the high voltage VPP can decrease with an increase in the operation speed.

Figure 25:
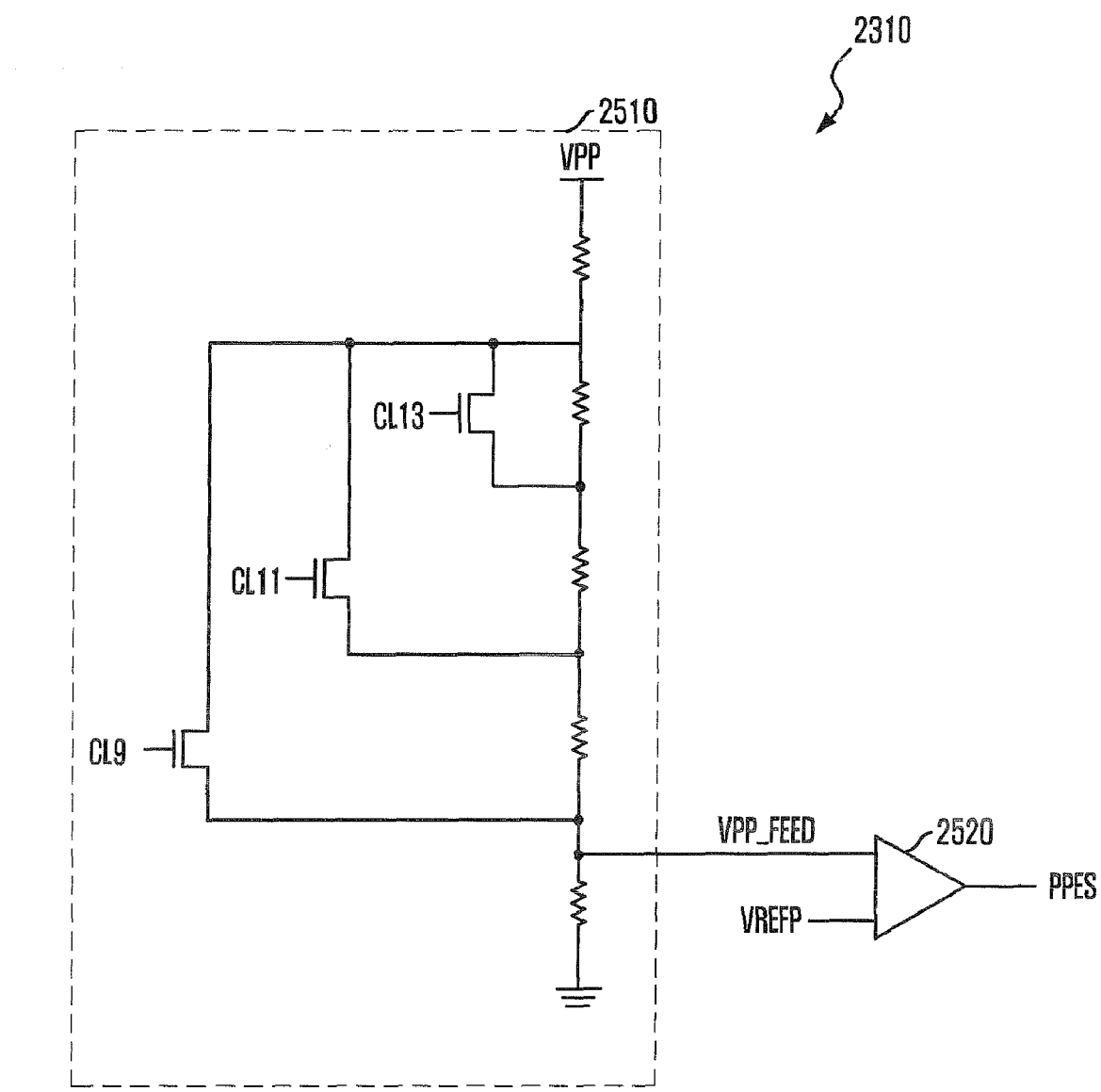
FIG. 25 is a circuit diagram of the high voltage detector 2310 of FIG. 23 in accordance with another embodiment of the invention.

FIG. 25 is a circuit diagram of the high voltage detector 2310 of FIG. 23 in accordance with another embodiment of the invention.

Referring to FIG. 25, the high voltage detector 2310 includes a voltage divider 2510 and a comparator 2520 like the high voltage detector 2410 of FIG. 24.

The high voltage detector of FIG. 25 is identical in operation and effect to the high voltage detector of FIG. 24 with the exception that the voltage divider 2510 is slightly different in configuration from the voltage divider 2410, and thus its more detailed description will be omitted for conciseness.

As described above, the semiconductor device including the internal voltage generator circuit in accordance with the invention changes the level of its internal voltage depending on the operation speed of the semiconductor device. In general, as the operation speed of a semiconductor device increases, the power consumption increases and thus an internal voltage with a higher level is required. The invention can satisfy the above requirement, thus making it possible to provide a stable operation even when the operation speed of the semiconductor device increases.

While the invention has been described with respect to the specific embodiments, it will be apparent to those skilled in the art that various changes and modifications may be made without departing from the spirit and scope of the invention as defined in the following claims.

What is claimed is:

1. An internal voltage generator circuit, comprising:
   a frequency detector configured to detect a frequency of an external clock by comparing the external clock with an internal reference clock to output operation speed information;
   a differential amplifier configured to output a driver control signal in response to a feed-back voltage of an internal voltage and a reference voltage;
   a driver configured to drive the internal voltage in response to the driver control signal; and
   a voltage divider configured to divide the internal voltage to generate the feed-back voltage of the internal voltage, wherein a division ratio of the internal voltage depends on the operation speed information.

2. The internal voltage generator circuit of claim 1, the voltage divider includes a plurality of voltage divider units configured to divide the internal voltage to generate the feed-back internal voltage and at least one of the voltage divider units is configured to be electrically shorted or opened depending on the operation speed information.

3. The internal voltage generator circuit of claim 1, wherein the differential amplifier includes an operational amplifier.

4. The internal voltage generator circuit of claim 1, wherein the driver includes a transistor configured to receive the driver control signal through a gate thereof to drive the internal voltage.

5. The internal voltage generator circuit of claim 1, wherein the internal voltage generator circuit is configured for use in a semiconductor memory device.

* * * * *